United States Patent [19]
Ando et al.

[11] Patent Number: 5,243,406
[45] Date of Patent: Sep. 7, 1993

[54] METHOD AND APPARATUS FOR MEASURING THREE-DIMENSIONAL CONFIGURATION OF WIRE-SHAPED OBJECT IN A SHORT TIME

[75] Inventors: Moritoshi Ando; Hiroyuki Tsukahara, both of Atsugi; Yoshitaka Oshima, Isehara, all of Japan

[73] Assignee: Fujitsu Limited, Kawasaki, Japan

[21] Appl. No.: 725,673

[22] Filed: Jul. 3, 1991

[30] Foreign Application Priority Data

Jul. 4, 1990 [JP] Japan .................................. 2-179005

[51] Int. Cl.$^5$ .......................................... G01B 11/24
[52] U.S. Cl. ...................... 356/376; 356/394
[58] Field of Search ............. 356/376, 394, 446, 237; 250/560; 382/8

[56] References Cited

U.S. PATENT DOCUMENTS

| | | | |
|---|---|---|---|
| 4,583,861 | 4/1986 | Yamaji et al. | 356/446 |
| 4,728,195 | 3/1988 | Silver | 356/394 |
| 4,740,708 | 4/1988 | Batchelder | 356/237 |
| 4,942,618 | 7/1990 | Sumi et al. | 382/8 |
| 4,973,164 | 11/1990 | Weber et al. | 356/446 |

FOREIGN PATENT DOCUMENTS

| | | |
|---|---|---|
| 0341806 | 11/1989 | European Pat. Off. . |
| 0346015 | 12/1989 | European Pat. Off. . |
| 0435326 | 7/1991 | European Pat. Off. . |
| 187604 | 11/1982 | Japan .................................. 356/376 |
| 260105 | 11/1986 | Japan .................................. 356/376 |
| 63-6679 | 1/1988 | Japan . |
| 1-116405 | 5/1989 | Japan . |
| 1-246841 | 10/1989 | Japan . |

OTHER PUBLICATIONS

IBM Technical Disclosure Bulletin, vol. 32, No. 8B, Jan. 1990, New York, "Lighting Method for Automatic Solder Bond Inspection," pp. 11–12.

*Primary Examiner*—F. L. Evans
*Attorney, Agent, or Firm*—Staas & Halsey

[57] ABSTRACT

A method of measuring a wire-shaped object comprises a scanning step of scanning a light beam on the surface of the wire-shaped object, a detection step of detecting a reflected light reflected from the surface of the wire-shaped object by a plurality of optical sensor cells, the optical sensor cells being mounted on an inner wall of a reflected light detection unit located over the wire-shaped object; and a measurement step of measuring a three-dimensional configuration of the wire-shaped object in accordance with output signals from the plurality of optical sensor cells, whereby, the three-dimensional configuration of the wire-shaped object is automatically measured in a short time.

26 Claims, 18 Drawing Sheets

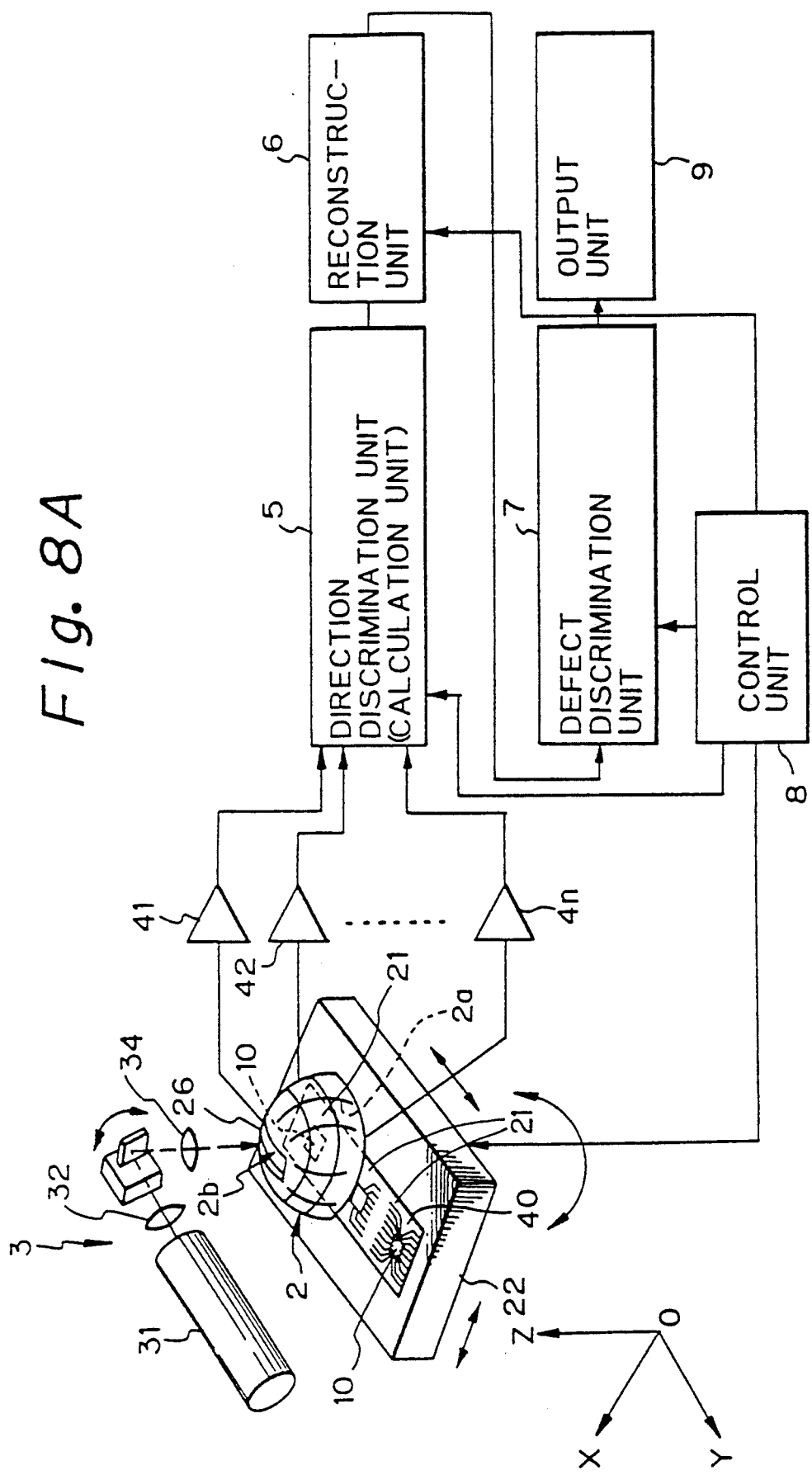

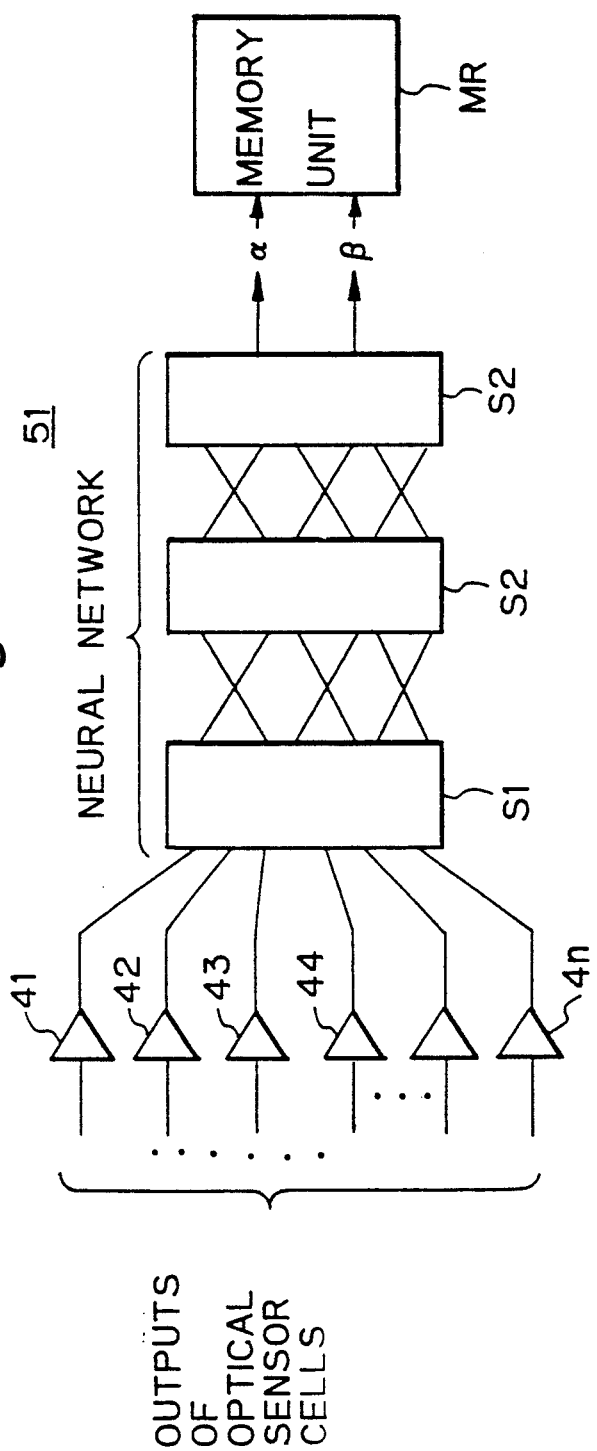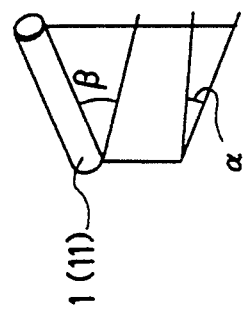

$$h = \sum_{i=1}^{m} \frac{l}{\cos\alpha_i} \times \tan\beta_i$$

$\alpha \rightarrow$: SEARCH DIRECTION
$\alpha_i$: WHEN $\beta = 0$
m:
h: HEIGHT OF BONDING WIRE

MEMORY UNIT (MR)

ANGLE DATA OF BONDING WIRE

METHOD AND APPARATUS FOR MEASURING THREE-DIMENSIONAL CONFIGURATION OF WIRE-SHAPED OBJECT IN A SHORT TIME

BACKGROUND OF THE INVENTION

1. Field of the Invention

The present invention relates to a method and an apparatus for measuring a wire-shaped object, more particularly, to a method and an apparatus for measuring a three-dimensional configuration of a bonding wire for a semiconductor device in a short time, by using a light beam projection method. Note, this bonding wire is, for example, for an electrical connection between a semiconductor chip and a lead frame, or an IC chip and a package, and the present invention is applied to detect an abnormal approach portion and an abnormal connection portion between two adjacent bonding wires or a bonding wire and a semiconductor chip (substrate), by measuring the three-dimensional configuration thereof.

2. Description of the Related Art

Recently, the number of bonding wires connected between a semiconductor chip (IC chip) and a lead frame (package) has multiplied, in accordance with a high densification and miniaturization of the semiconductor chip; for example, it is not unusual for one semiconductor chip to include more than one hundred bonding wires.

In such a semiconductor chip including over one hundred bonding wires, the wire pitch (space between adjacent bonding wires) is very narrow, e.g., about 0.2 mm, and thus production errors may frequently occur due to a short-circuiting between adjacent bonding wires or a bonding wire and a semiconductor chip, during a wire-bonding process and the like.

In the prior art, the test for detecting the production errors is carried out by a manual visual observation using a microscope, and thus the accuracy and speed of the test are limited. Further, in the prior art, the shape of the bonding wire is only measured two-dimensionally, in a horizontal plane, and thus a defective portion of an extreme approach, or a short-circuiting between the wire and a semiconductor chip located under the wire, cannot be detected in a vertical plane.

In consideration of the above, many methods and apparatuses for measuring the three-dimensional configuration of a wire-shaped object (bonding wire) have been disclosed.

In the prior art, three methods are used to measure the three-dimensional configuration of a bonding wire, i.e., a floodlight method, a stereoscopic vision method, and a variable focus method. Concretely, in the prior art, apparatuses for measuring a three-dimensional configuration of a wire-shaped object (for example, a bonding wire) are disclosed in Unexamined Japanese Patent Publication (Kokai) Nos. 63-6679, 1-116405, and 1-246841; however, these apparatuses require long time for measuring the three-dimensional configuration of the bonding wire, and further, some of these apparatuses cannot correctly measure the three-dimensional configuration of the bonding wire.

SUMMARY OF THE INVENTION

An object of the present invention is to provide a method and an apparatus for measuring a wire-shaped object, by which automatic measuring of a three-dimensional configuration of a wire-shaped object can be made in a short time.

According to the present invention, there is provided a method of measuring a wire-shaped object including a surface having a regular reflection and a circular section, characterized in that the method comprises the steps of: scanning a light beam on the surface of the wire-shaped object; detecting reflected light reflected from the surface of the wire-shaped object by a plurality of optical sensor cells, the optical sensor cells being mounted on an inner wall of a reflected light detection unit located over the wire-shaped object; and measuring the three-dimensional configuration of the wire-shaped object in accordance with output signals from the plurality of optical sensor cells.

The measuring step may include the steps of: confirming positions of the plurality of optical sensor cells outputting the output signals by receiving the light reflected in response to the scanned light beam; and measuring the three-dimensional configuration of the wire-shaped object in accordance with the confirmed positions of the plurality of optical sensor cells.

Further, according to the present invention, there is also provided an apparatus for measuring a wire-shaped object including a surface of a regular reflection and a circular section, wherein the apparatus comprises: a light beam scanning unit for scanning a light beam on the surface of the wire-shaped object; a reflected light detection unit for covering the wire-shaped object; a plurality of optical sensor cells, mounted on the inner wall of the reflected light detection unit, for detecting light reflected from the surface of the wire-shaped object, and each of the optical sensor cells including an address indicating a position in the reflected light detection unit; a calculation unit, which receives output signals from the plurality of optical sensor cells, for calculating the direction of a bright line formed by the reflected light in accordance with the output signals from the plurality of optical sensor cells and with the address of the optical sensor cell receiving the reflected light; and a reconstruction unit, which receives the output of the calculation unit, for reconstructing the three-dimensional configuration of the wire shaped body from the results of the calculation unit.

The reflected light detection unit may be formed as a hemisphere-shaped dome or so as to have a half polyhedron shape. The light beam scanning unit may comprise: a beam source for generating a light beam; a group of lenses for enlarging the diameter of the light beam, as output from the beam source; a vibrating mirror for linear scanning of the light beam; and a focusing lens for focusing the light beam onto the surface of the wire-shaped object. A top portion of the reflected light detection unit may have an opening in the form of a slit, and the light beam scanned by the light beam scanning unit may impinge on the wire-shaped object through the slit of the reflected light detection unit.

The wire-shaped object may be a bonding wire connecting a semiconductor chip and a lead frame. The semiconductor chip and the lead frame may be placed on a detection table. The detection table may be movable in an X-Y plane and rotatable around a Z-axis.

The apparatus may further comprise: a defect discrimination unit for discriminating the quality of the reconstructed data output from the reconstruction unit by comparing the reconstructed data with a reference three-dimensional data; a control unit for controlling the movement of the detection table and for controlling the operations of the direction discrimination unit, the reconstruction unit, and the defect discrimination unit; and an output unit for receiving and outputting the results obtained from the defect discrimination unit.

The light beam scanning unit may comprise: a beam source for generating a light beam; a group of lenses for enlarging the diameter of the light beam output from the beam source; a first vibrating mirror for scanning the light beam in an X-direction; a second vibrating mirror for scanning the light beam in a Y-direction; and a focusing lens for focusing the light beam onto the surface of the bonding wire.

A top portion of the reflected light detection unit may have for circular opening allowing a passage therethrough of the light beam scanned in both an X-direction and a Y-direction by the light beam scanning unit. The light beam may be scanned in a square-shape along the circumference of the semiconductor chip. Further, the light beam may be scanned as going and returning (i.e., forward and reverse directions) along each side of the semiconductor chip.

The calculation unit may be constituted (i.e., implemented by a neural network, and the reconstruction unit may be constituted by an angle calculation unit. The apparatus may further comprise: a control unit; a scanning position control unit for controlling the light beam scanning unit in accordance with control signals output from the control unit; a dictionary unit for prestoring reference position and direction data; a comparison unit for comparing the results of the angle calculation unit with the reference position and direction data output from the dictionary unit; and a defect output unit for receiving and outputting the compared results from the comparison unit.

BRIEF DESCRIPTION OF THE DRAWINGS

The present invention will be more clearly understood from the description of the preferred embodiments as set forth below with reference to the accompanying drawings, wherein:

FIG. 8A is a diagram indicating a modification of the embodiment apparatus shown in FIG. 4;

FIG. 13A is a diagram indicating a configuration of the neural network shown in FIG. 12;

FIG. 13B is a diagram indicating angles obtained by the neural network shown in FIG. 13A;

DESCRIPTION OF THE PREFERRED EMBODIMENTS

First, various bonding wire connections between a semiconductor chip and a lead frame, and examples of a method of measuring a three-dimensional configuration of a bonding wire according to the prior art will be explained.

Figure 1A:
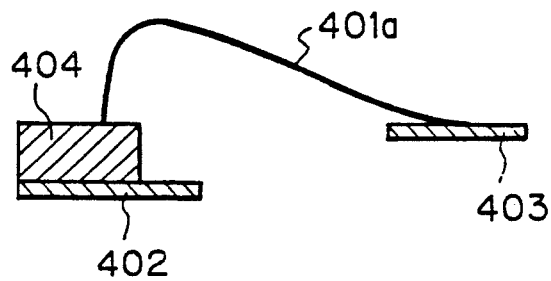
FIGS. 1A to 1D are diagrams indicating various bonding wire connections between a semiconductor chip and a lead frame.
Figure 1B:
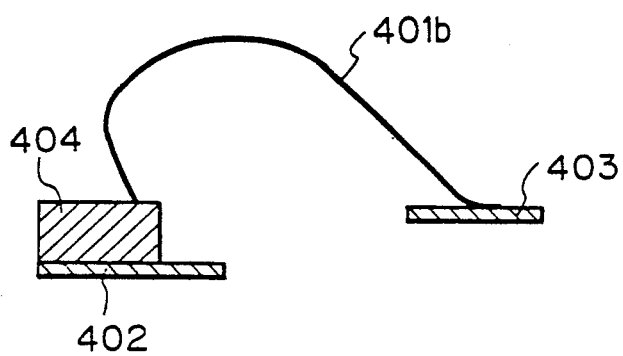
Figure 1C:
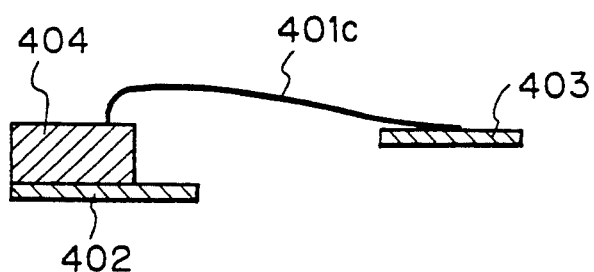
Figure 1D:
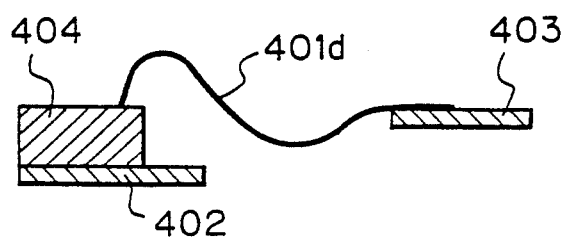

FIGS. 1A to 1D are diagrams indicating various bonding wire connections between a semiconductor chip and a lead frame, wherein, FIG. 1A indicates a normal, or preferable condition of the connected bonding wire, and FIGS. 1B to 1D indicate abnormal, or defective conditions of the connected bonding wires, respectively.

In FIGS. 1A to 1D, reference numerals 401a to 401d denote bonding wires, 402 and 403 denote parts of a lead frame, and 404 denotes a semiconductor chip (IC chip). Note, as shown in FIGS. 1A to 1D, the bonding wire (401a to 401d) is used to electrically connect the semiconductor chip 404 and the lead frame 403, or an IC chip and a package.

As shown in FIG. 1A, a normal bonding wire 401a is connected between the semiconductor chip 404 and the lead frame 403 in accordance with a preferable length of the bonding wire 401a, or a preferable three-dimensional configuration thereof. Conversely, as shown in FIGS. 1B to 1D, abnormal bonding wires 401b to 401d are connected between the semiconductor chip 404 and the lead frame 403 due to a defective three-dimensional configuration of the bonding wires 401b to 401d. Namely, FIG. 1B indicates a state when the bonding wire 401b is slack, FIG. 1C indicates a state when the bonding wire 401c is under an excessive strain, and FIG. 1D indicates a state when the bonding wire 401d sags. These respective states of the bonding wires 401b to 401d shown in FIGS. 1B to 1D may cause production errors due to a short-circuiting between adjacent bonding wires or a bonding wire and a semiconductor chip, and consequently, the above defective states of the bonding wires 401b to 401d shown in FIGS. 1B to 1D must be avoided by measuring the three-dimensional configurations thereof.

In the prior art, when testing or detecting such production errors, the defective portions (defective bonding wires) are generally detected manually by an observation of the connection portions of the bonding wires, using a microscope.

In the method and the apparatus for the measuring wire-shaped object according to the prior art, therefore, the test for detecting the production errors is carried out by a manual visual observation, and thus the accuracy and speed of the test are limited. Further, in the prior art, the shape of the bonding wire is measured only two-dimensionally, or in a horizontal plane, and thus a defective portion of an extreme approach between the wires (extremely small space between adjacent wires) in the horizontal plane can be detected, but a defective portion of an extreme approach between the wire and a substrate (or a semiconductor chip) located under the wire cannot be detected in a vertical plane.

Figure 2:
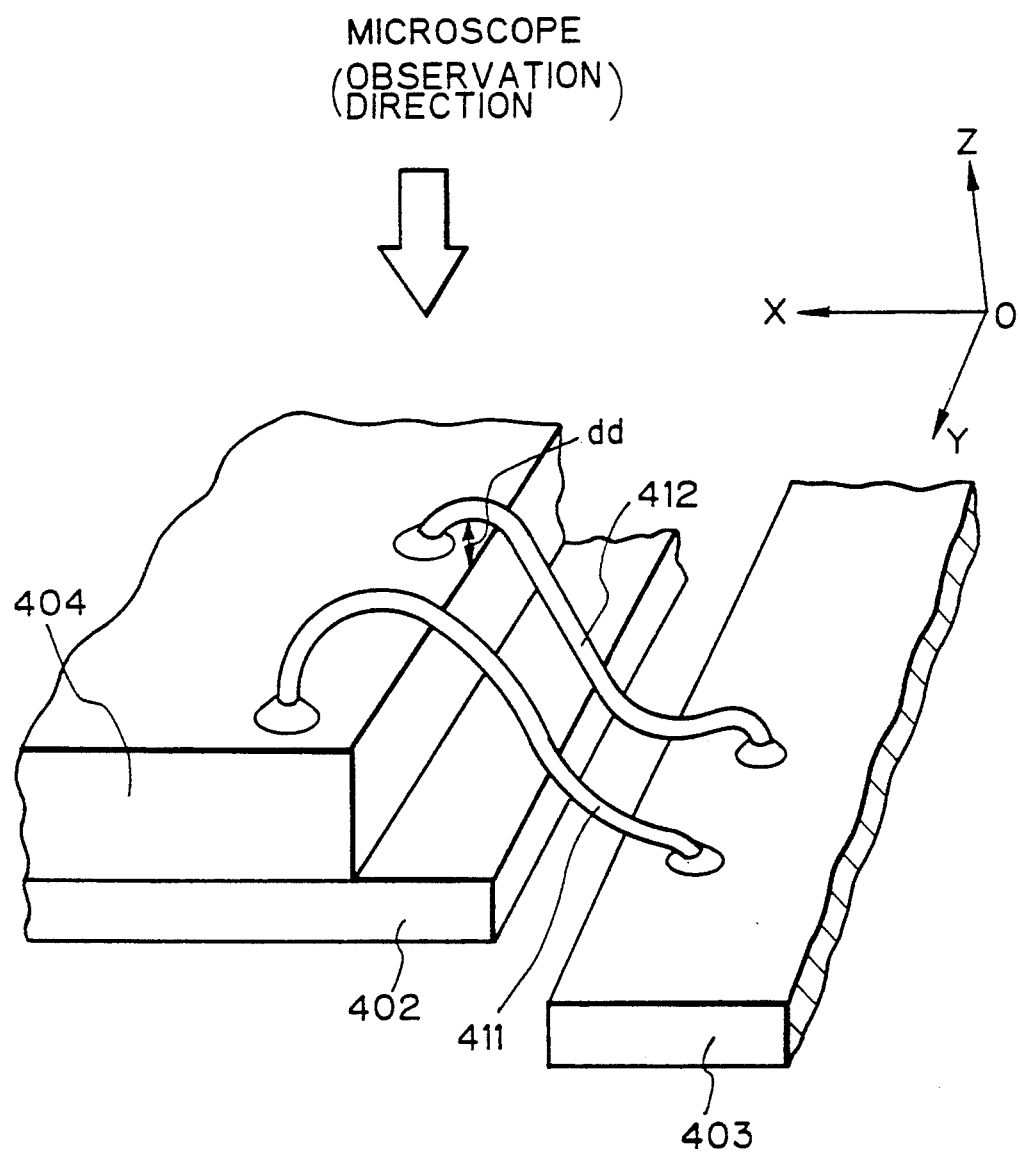
FIG. 2 is a diagram indicating a problem with a bonding wire connected between the semiconductor chip and the lead frame.

FIG. 2 indicates a problem with a bonding wire connected between the semiconductor chip and the lead frame. In FIG. 2, reference numerals 411 and 412 denote bonding wires, 402 and 403 denote parts of a lead frame, and 404 denotes a semiconductor chip. Note, the bonding wire 411 is connected between the semiconductor chip 404 and the lead frame 403 in a preferable state, and the bonding wire 412 is connected between the semiconductor chip 404 and the lead frame 403 in a defective state.

As shown in FIG. 2, the two wires 411 and 412 are observed as two adjacent lines by a microscope (observation direction). Namely, data for a Z-axis direction (or height direction) cannot be detected by the microscope, and only two-dimensional data for an X-axis and a Y-axis in a horizontal plane are only observed. For example, when the wire 412 is given an extreme approach to a corner of the semiconductor chip 404 in the Z-direction, as shown by a reference dd in FIG. 2, this defective state cannot be observed by a microscope as employed in the prior art.

In consideration of the above, a plurality of methods and apparatuses for measuring a three-dimensional configuration of a wire-shaped object (bonding wire) have been studied and provided.

Figure 3A:
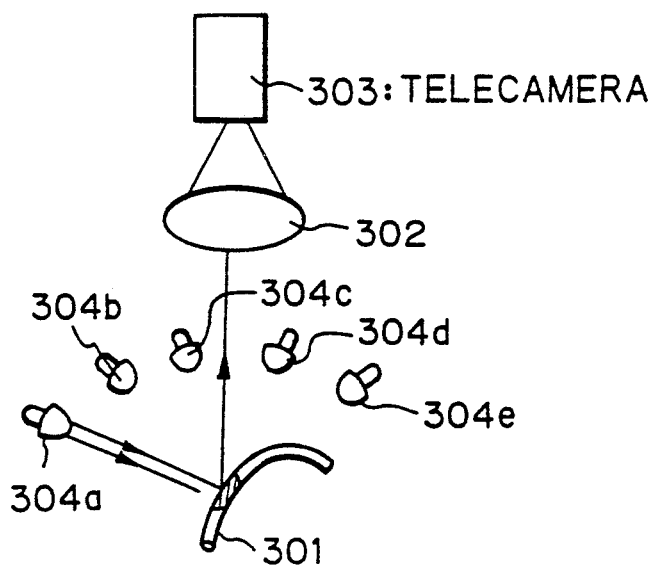
FIGS. 3A to 3C are diagrams for explaining examples of methods of measuring a three-dimensional configuration of a bonding wire according to the prior art.
Figure 3B:
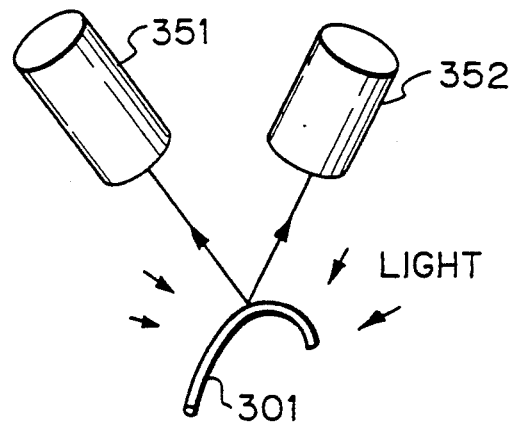
Figure 3C:
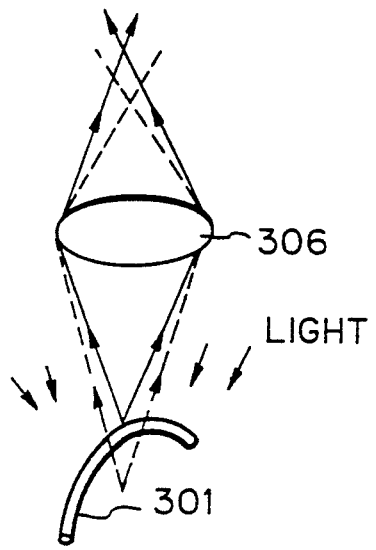

FIGS. 3A to 3C are diagrams for explaining examples of methods of measuring the three-dimensional configuration of a bonding wire according to the prior art. Note, FIG. 3A indicates an example of a floodlight method, FIG. 3B indicates an example of a stereoscopic vision method, and FIG. 3C indicates an example of a variable focus method of measuring the three-dimensional configuration of a bonding wire (wire-shaped object).

In FIG. 3A, reference numeral 301 denotes a bonding wire, 302 denotes a lens, 303 denotes a telecamera, and 304a to 304e denote light sources. In this device using the floodlight method, each of the light sources 304a to 304e successively impinges a light beam onto a surface of the bonding wire 301, and light reflected from the surface of the bonding wire 301 is detected by the telecamera 303 through the lens 302. Consequently, the three-dimensional configuration of the bonding wire is determined (measured) by combining the reflected light beams respectively corresponding to the light sources 304a to 304e, as detected by the telecamera 302. Note, in this prior art example, a plurality of light sources 304a to 304e are used such that the light sources 304a to 304e successively impinges their respective light beams onto the surface of the bonding wire 301, and thus it takes a long time to determine the three-dimensional configuration of the bonding wire.

In FIG. 3B, reference numerals 351 to 352 denote telecameras. In this device using the stereoscopic vision method, the bonding wire 301 is lit from various directions, and the reflected light beams are detected by two telecameras 351, 352, so that a stereoscopic image of the bonding wire 301 can be obtained by the two telecameras 351, 352. In this prior art example, however, two telecameras 351, 352 and an image processing unit for constructing a three-dimensional configuration of the bonding wire are required, and thus the cost of the apparatus is high.

In FIG. 3C, reference numeral 306 denotes a lens (group of lenses) of which the focal point thereof can be moved. In this device using the variable focus method, the focal point of the lens 306 is varied from a front focus to a rear focus, or an in-and-out of focus state, at each measuring point of the bonding wire 301, and all of the in-focus points are combined to determine the three-dimensional configuration of the bonding wire 301. In this prior art, however, the in-focus point for each of the measuring point is obtained by varying the focal point from the front focus to the rear focus using a mechanical system, and thus it takes a long time to determine the three-dimensional configuration of the bonding wire. Further, currently, the three-dimensional configuration of the bonding wire cannot be correctly determined by using the variable focus method of mechanical system.

Note, the method and apparatus for measuring a wire-shaped object according to the present invention uses the floodlight method (including a light beam projection method), whereby an abnormal approached portion and an abnormal connection portion between two adjacent bonding wires or a bonding wire and a semiconductor chip (substrate) can be correctly measured in a short time.

Next, preferred embodiments of an apparatus for measuring the three-dimensional configuration of a wire-shaped object according to the present invention will be explained below.

Figure 4:
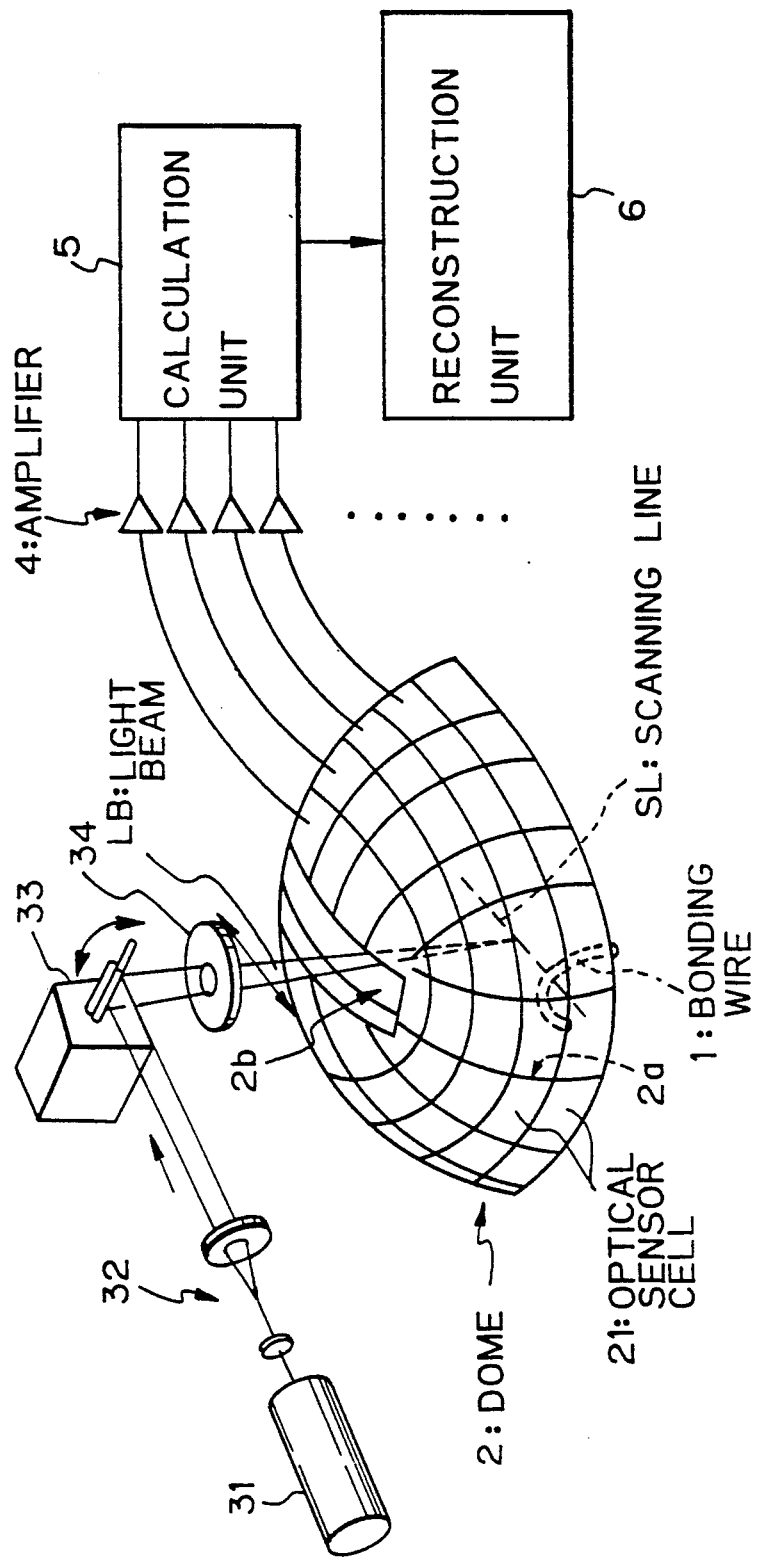
FIG. 4 is a diagram indicating an embodiment of an apparatus for measuring a three-dimensional configuration of a wire-shaped object according to the present invention.

FIG. 4 is a diagram indicating an embodiment of an apparatus for measuring the three-dimensional configuration of a wire-shaped object according to the present invention. In FIG. 4, reference numeral 1 denotes a bonding wire (wire-shaped object), 2 denotes a dome for detecting reflected light (or a bright line), 3 denotes a light beam scanning unit, 4 denotes a plurality of amplifiers, 5 denotes a calculation unit, and 6 denotes a reconstruction unit. Note, the bonding wire 1 includes a surface having a regular reflection and a circular section.

The light beam scanning unit 3, which is used to scan a light beam onto a surface of the bonding wire 1, comprises a beam source 31 for generating a light beam (or a laser beam), the group of lenses 32 for enlarging a diameter of the light beam output from the beam source 31, a vibrating mirror 33 for producing linear scanning of the light beam, and a focusing lens 34 for focusing the light beam LB onto the surface of the bonding wire 1. Namely, a scanning line SL, which is a locus of a focal point of the light beam LB, is formed on the bonding wire 1 (or a plane at the position of the bonding wire) by the light beam scanning unit 3.

Figure 6:
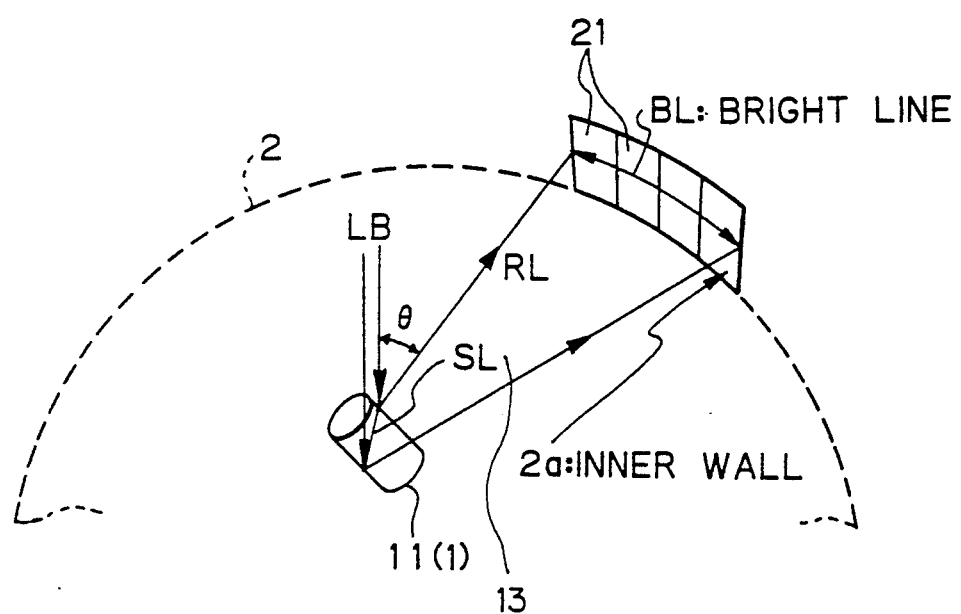
FIG. 6 is a diagram for explaining a bright line detected by an inner wall of a dome shown in FIG. 4.

The dome 2, which has a hemispherical shape and is located over the bonding wire 1, includes a plurality of optical sensor cells 21 mounted on an inner wall 2a (as indicated in FIG. 6) of the dome 2. Note, a slit 2b is formed in the top of the dome 2 to allow the light beam LB to pass therethrough. Further, the detection surface of each of the sensor cells 21 faces the bonding wire 1, and an address indicating the position in the dome 2 is provided for each of the sensor cells 21. Furthermore, output signals of the sensor cells 21 are applied to corresponding amplifiers 4, and output signals of the amplifiers 4 are applied to the calculation unit 5.

The calculation unit 5 is used to calculate a projected direction of reflected light (RL) on the inner wall of the dome 2. Note, the reflected light, which will be explained later in detail, is a light reflected by the surface of the bonding wire 1 in accordance with the scanning line SL. The reconstruction unit 6 is used to reconstruct the three-dimensional configuration of the bonding wire 1 by receiving the results of the calculation unit 5.

Figure 15:
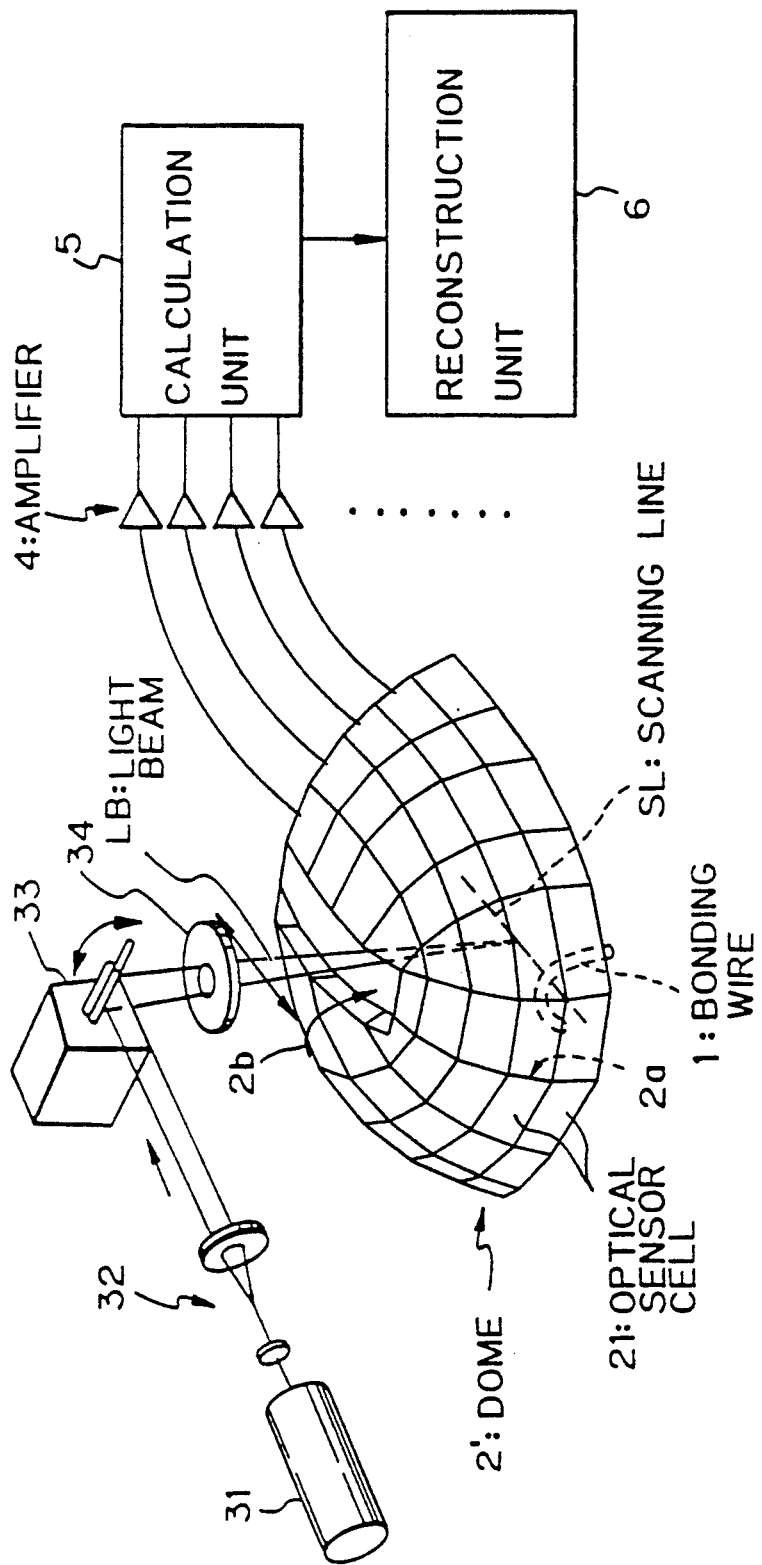
FIG. 15 is a modification of the embodiment of FIG. 4 illustrating a polyhedral dome.

Note, as shown in FIG. 4, the dome 2 preferably has a hemispherical shape, but the shape of the dome (reflected light detection unit) 2 is not limited thereto. Namely, the shape of the reflected light detection unit 2 can be a polygon. When forming the reflected light detection unit 2 as a polyhedron, preferably a plurality of planes forming the polyhedron are defined, as shown in FIG. 15 for the dome 2' (other elements thereof being the same as the identically numbered elements in FIG. 4). Further, the reflected light detection unit 2 need not have a closed plane, but a plurality of optical sensor cells 21 should be mounted on the inner wall 2a, and thus the reflected light detection unit 2 can be constituted as a net. When the reflected light detection unit 2 is formed as a net, the semiconductor chip position in the reflected light detection unit 2 can be observed from the outer position (i.e., the exterior) of the reflected light detection unit 2.

Figure 5A:
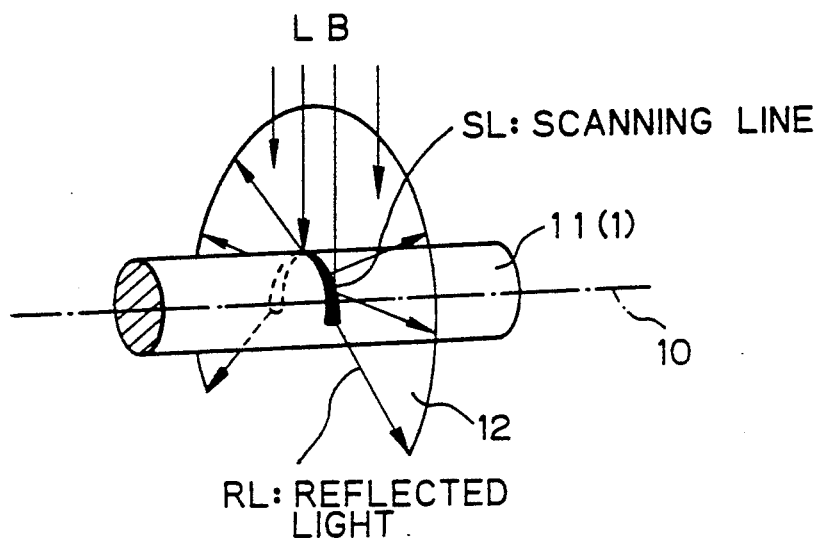
FIGS. 5A and 5B are diagrams for explaining light reflected from a surface of the wire-shaped object.
Figure 5B:
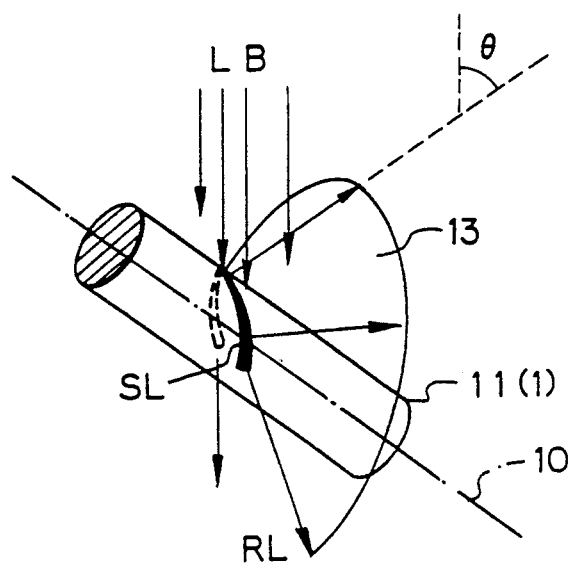

FIGS. 5A and 5B are diagrams for explaining light reflected from a surface of the wire-shaped object, and FIG. 6 is a diagram for explaining a bright line detected by an inner wall of a dome shown in FIG. 4.

As shown in FIG. 5A, for example, when scanning a light beam LB at right angles to an axis 10 of the wire-shaped object 11 (bonding wire 1), all reflected light RL passes through the same plane 12 at right angles to the axis 10 of the wire-shaped object 11.

On the other hand, as shown in FIG. 5B, when scanning a light beam at specific angle $\theta$ to the axis 10 of the wire-shaped object 11, the reflected light passes through a specific curvature plane 13 without passing through the above plane 12. As shown in FIG. 6, a bright line BL, which is curved in accordance with the angle $\theta$ between the light beam and the axis 10 of the wire-shaped object 11, is drawn on the inner wall 2a of the dome 2 in accordance with the plane curvature (13). Note, the angle $\theta$ between the direction of the light beam LB and the axis 10 of the wire-shaped object 11 is required to equal or exceed 45 degrees, Namely, when the angle $\theta$ is specified below 45 degrees, the light reflected from the surface of the wire-shaped object 11 cannot be incident on the inner wall 2a of the dome 2.

In the above, the positions of the bright line BL are determined by the positions of the optical sensors 21 detecting the bright line BL. Further, a slant (or a curve) of the bright line BL is determined by an arrangement of the optical sensors 21 detecting the bright line BL. Furthermore, when the diameter of the wire-shaped object 11 (bonding wire 1) is previously known, the slope of the bright line BL can be obtained in accordance with the respective directions of a plurality of posiitons of the bright line BL.

As described above, in the embodiment of the apparatus for measuring the three-dimensional configuration of the wire-shaped object according to the present invention, when a light beam LB is linearly scanned on a surface of the wire-shaped object including a surface having a regular reflection and a circular section, a bright line BL, formed on an inner wall 2a of a dome 2 by reflected light BL, is detected by a plurality of optical sensors 21 mounted on the inner wall 2a of the dome 2. Further, the positions and the curvature of the bright line BL are calculated by the results detected by the optical sensors 21, and a three-dimensional configuration of the wire shaped body is reconstructed thereby. Note, the position or the curvature of the bright line is changed in accordance with the height or angle of the wire.

Figure 7:
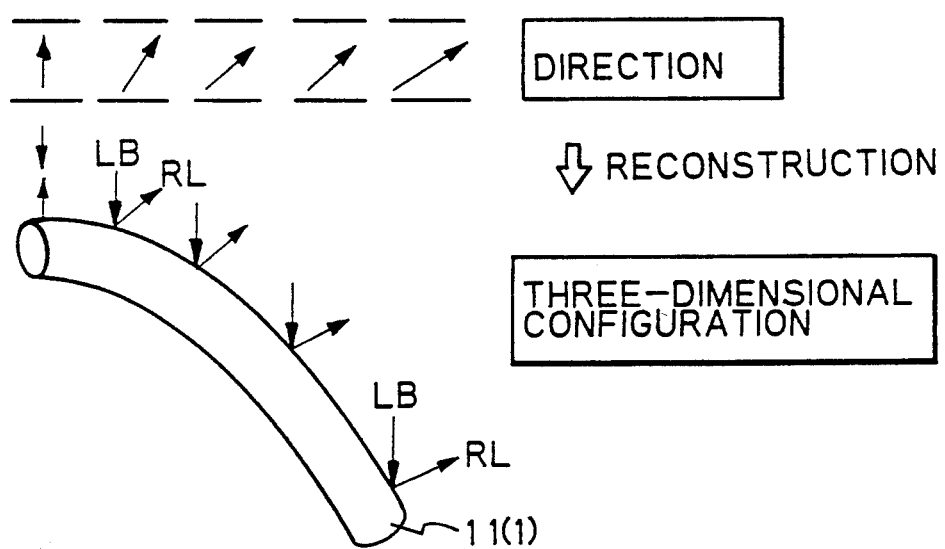
FIG. 7 is a conceptual diagram of the reconstruction of the three-dimensional configuration of the wire-shaped object by discriminating each direction of the reflected light.

FIG. 7 is a conceptual diagram of the reconstruction of a three-dimensional configuration of the wire-shaped object, formed by discriminating each direction of the reflected light (bright line).

As shown in FIG. 7, the entire three-dimensional configuration of the wire-shaped object 11 is reconstructed by combining the calculated results of the small areas of the wire-shaped object 11.

Figure 8B:
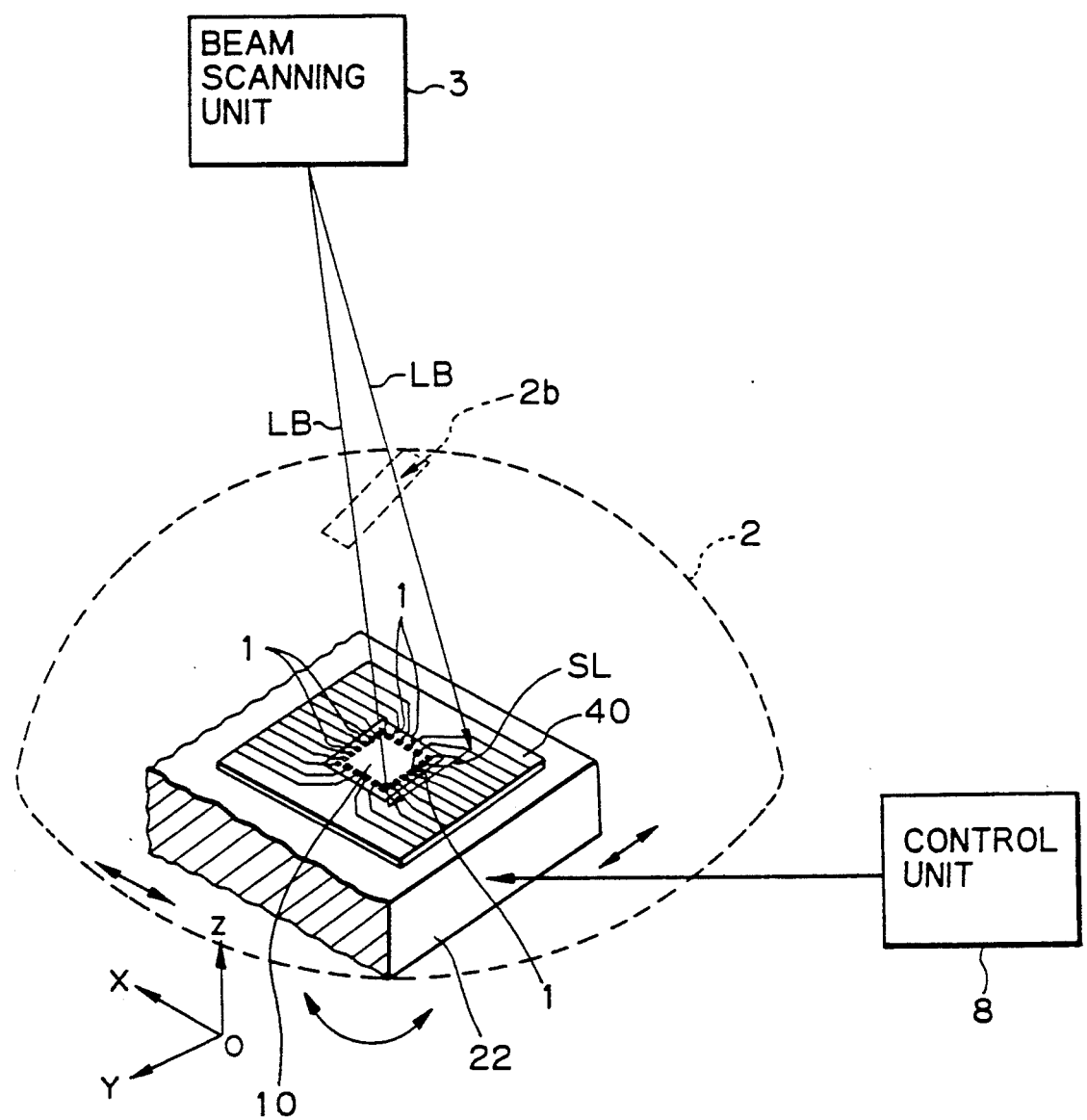
FIG. 8B is a diagram indicating a part of the modification shown in FIG. 8A.

FIG. 8A is a diagram indicating a modification of the embodiment apparatus shown in FIG. 4, and FIG. 8B is a diagram indicating a part of the modification shown in FIG. 8A.

In FIG. 8A, reference numeral 1 denotes a bonding wire, 3 denotes a light beam scanning unit, 4l to 4n denote amplifiers, 5 denotes a direction discrimination unit (calculation unit), 6 denotes a reconstruction unit, 7 denotes a defect discrimination unit, 8 denotes a control unit, 9 denotes an output unit, 10 denotes a semiconductor chip, 22 denotes a detection table (X-Y stage), and 40 denotes a lead frame.

The light beam scanning unit 3 comprises a beam source 31 for generating a light beam (or a laser beam), a group of lenses 32 for enlarging the diameter of the light beam output from the beam source 31, a vibrating mirror 33 for producing linear scanning of the light beam, and a focusing lens 34 for focusing the light beam LB onto the surface of the bonding wire 1. Namely, a scanning line SL, which is a locus of the focal point of the scanning light beam LB, is formed on the bonding wire by the light beam scanning unit 3.

As shown in FIG. 8A, the detection table 22 can be moved in an X-Y plane and can be rotated around a Z-axis (at the center of the detection table 22) to scan a light beam LB on all of the bonding wires 1 through a slit 2b of the dome 2 in accordance with output signals of the control unit 8. Further, as shown in FIGS. 8A and 8B, a plurality of semiconductor chips 10, which are connected to the lead frame 21 by a plurality of bonding wires 1, are placed on the detection table 22, and the light beam LB is scanned at the required positions (test portions) of the bonding wires 1, or the scanning line SL is placed at the required positions of the bonding wires 1 by a parallel and rotational displacement of the detection table 22.

The dome 2, which is formed as a hemisphere, is provided over the detection table 22. Note, a slit 2a is formed on a top of the dome 2 to allow the passage of the light beam LB through the dome 2, and the light beam LB impinges on a test portion (required position) of the bonding wire 1. Note, the bonding wire 1 includes a surface having a regular reflection and a circular section. Further, the dome 2 is preferably formed as a hemisphere, but the shape of the dome (reflected light detection unit) 2 is not limited thereto. Namely, the shape of the reflected right detection unit 2 can be a polygon. Further, the reflected light detection unit 2 need not have a closed plane, but a plurality of optical sensor cells 21 should be mounted on the inner wall 2a, and thus the reflected light detection unit 2 can be implemented as a net. When the reflected light detection unit 2 is formed as a net, the semiconductor chip 10 and the lead frame 40, positioned in the dome 2 and placed on the detection table 22, can be observed from the outer position of the dome 2.

In the dome 2, a plurality of optical sensor cells 21 are mounted on an inner wall 2a of the dome 2, and the detection surface of each of the sensor cells 21 faces the bonding wire 1. Note, an address indicating a position in the dome 2 is provided for each of the sensor cells 21. Output signals of the sensor cells 21 are applied to corresponding amplifiers 4l to 4n, and output signals of the amplifiers 4l to 4n are applied to the direction discrimination unit (calculation unit) 5.

Note, if the dome 2 is assumed to be a sphere such as the earth, the above address is given by an intersection coordinate defined by a longitude $\phi$ (0 to 360 degree) for the equatorial direction (i.e., circumferential location) and a latitude $\lambda$ (0 to 90 degree) relative to the polar direction. For example, in a coordinate plane divided by one-degree increments, the total number of the intersection points of longitude and latitude are specified to $360 \times 90 = 32,400$, and thus, when defining a resolution to one-degree, the optical sensor cells 21 are supplied as 32,400 pieces, each including an address from $(\phi 0, \lambda 0)$ to $(\phi 360, \lambda 90)$, respectively. Furthermore, for example, in a coordinate plane divided by ten-degrees, the total number of the intersection points are specified as $36 \times 9 = 324$, and thus, when defining a resolution to ten-degrees, the optical sensor cells 21 are supplied as 324 pieces, each including an address from $(\phi 0, \lambda 0)$, $(\phi 10, \lambda 0)$, $(\phi 20, \lambda 0)$, ..., $(\phi 360, \lambda 0)$, $(\phi 360, \lambda 10)$, ..., $(\phi 360, \lambda 90)$, respectively.

In the above, each of the optical sensor cells 21 detects reflected light RL reflected from a measuring portion in accordance with the scan operation of the light beam LB, and each of the optical sensor cells 21 outputs an electrical signal by conversion of the reflected light RL. As described above, an address indicating a position in the dome 2 is provided for each of the sensor cells 21, and output signals of the sensor cells 21 are applied to corresponding amplifiers 4l to 4n provided for each of the addresses. Further, output signals of the amplifiers 4l to 4n are applied to the direction discrimination unit (calculation unit) 5.

In the direction discrimination unit 5, a center position of a bright line BL (with reference to FIG. 6) formed (drawn) on the inner wall 2a of the dome 2 by the reflected light RL, and a curved state (curvature) is discriminated therefrom. Note, if it is assumed that a length of the bright line is L, the center position is indicated by an address Ai of the point at L/2. For example, when only $\phi$ (longitude) of the address is changed, it is determined that the bright line BL is drawn for the direction of a specific latitude line passing through a pole point. Further, when only $\lambda$ (latitude) of the address is changed, it is determined that the bright line BL is drawn for the direction of a specific longitudinal line in parallel to the equatorial line. Furthermore, when both $\phi$ (longitude) and $\lambda$ (latitude) of the address are changed, it is discriminated that the bright line BL is drawn for the direction of a curved line, not in parallel to either the longitude line or the latitude line, and the curvature thereof is obtained by a changing of the addresses.

The reconstruction unit 6 reconstructs a three-dimensional configuration of a measurement portion (bonding wire 1) corresponding to the bright line BL, by using the above discriminated results, i.e., the center position, and the direction or the curvature of the bright line.

The defect discrimination unit 7 discriminates the quality of the reconstructed data by comparing it with previously stored, three-dimensional reference data (reference data of the measurement portion), and outputs the results to an output unit 9, e.g., a display device, a printer, and the like. Note, the control unit 8 is used to control the parallel displacement of the detection table 22 in the X-Y plane and/or the rotational displacement around the Z-axis of the detection table 22, and is used to output various signals for controlling the operations of the direction discrimination unit 5, the reconstruction unit 6, and the defect discrimination unit 7.

Next, examples of the operation of the present invention will be explained with reference to FIGS. 9 to 11.

Figure 9:
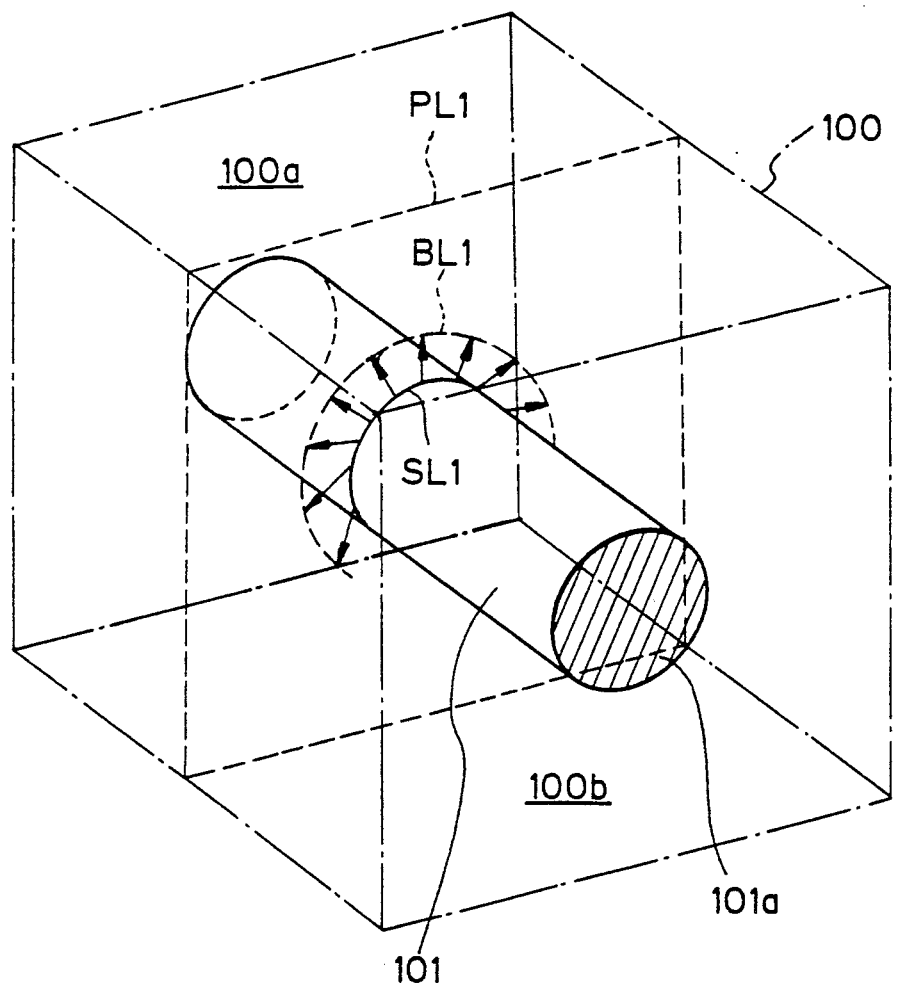
FIG. 9 is a diagram indicating reflected light when an axis of the wire-shaped object is located orthogonally to the light beam.

FIG. 9 is a diagram indicating reflected light when an axis of the wire-shaped object is located orthogonally to the light beam. In FIG. 9, reference numeral 101 denotes a tube (i.e., tubular) body, and 100 denotes a space frame model. Note, in FIG. 9, the space frame model 100 covered by virtual lines indicates a three-dimensional space, and a tube body 101 in contact with two opposite surfaces 100a and 100b indicates, for example, a part of a wire-shaped object 11 (or bonding wire 1).

First, when scanning and impinging a light beam (LB) onto a surface of the tube body 101 having a surface with a regular reflection and a circular section (101a), as described above, reflected light RL from the surface of the tube body 101 passes through the same plane at right angles to the tube body 101. Namely, as shown in FIG. 9, when scanning a light beam (LB) along a plane PL1 at right angles to an axis of the tube 101 from the upper position in the drawing, a scanning line SL1 is formed on the surface of the tube body 101. The reflected light (shown by an arrow in FIG. 9) is reflected from the surface of the tube body 101 in various directions, in accordance with the curvature of the surface of the tube body 101. Note, all reflected light passes through the same plane at right angles to the axis of the tube body 101, i.e., the plane PL1. Therefore, a bright line BL1, shown by a broken line in the drawing, is drawn on an inner wall (2a) of the dome (2) of FIG. 8A, along a curved surface of the inner wall. Note, this bright line BL1 coincides with the scanning direction of the light beam (LB), and thus in the plane PL1, and the bright line BL1 passes through a pole point (top position) of the dome.

Figure 10:
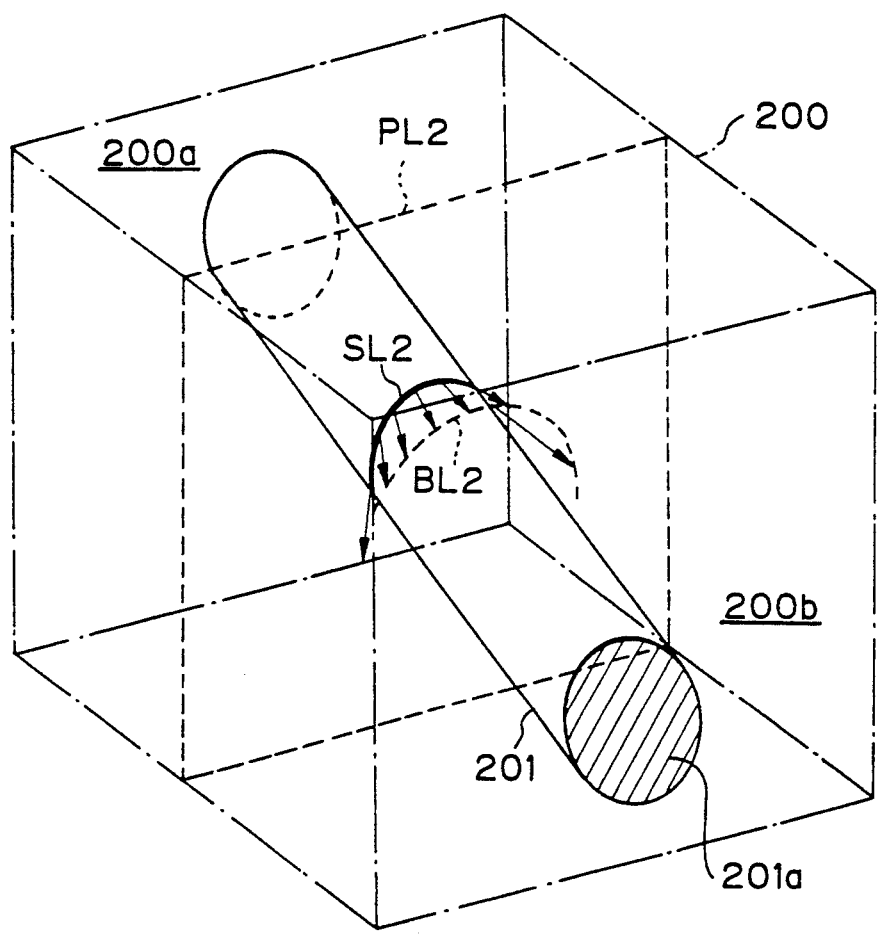
FIG. 10 is a diagram indicating reflected light when the axis of the wire-shaped object is located obliquely to the light beam.

FIG. 10 is a diagram indicating the reflected light when the axis of the wire-shaped object is located obliquely to the light beam. In FIG. 10, reference numeral 201 denotes a tube body which comprises a part of a wire-shaped object 11 (or bonding wire 1), and 200 denotes a space frame model.

Next, when scanning and impinging a light beam (LB) along a plane PL2 onto a surface of the tilted tube body 201 having a surface with a regular reflection and a circular section, a scanning line SL2 formed on the surface of the tube body 201 is defined as an ellipse, which has the same shape as an end face 201a of the tube body 201, and the reflected light from the scanning line SL2 does not pass through the plane PL2 but passes through a curvature plane having an inclined angle which is determined in accordance with a slope of the tilted tube body 201. Therefore, a bright line BL2 drawn on the inner wall (2a) of the dome (2) of FIG. 8A by reflected light (RL) is shown as a specific curved line. Note, the specific curved line of the reflected light is determined by the curvature of the curved surface and the curvature of the inner wall of the dome, and further, the positions of the bright line BL2 are shifted from the pole point of the dome in accordance with the angle between the tube body 201 and the plane PL2.

Figure 11:
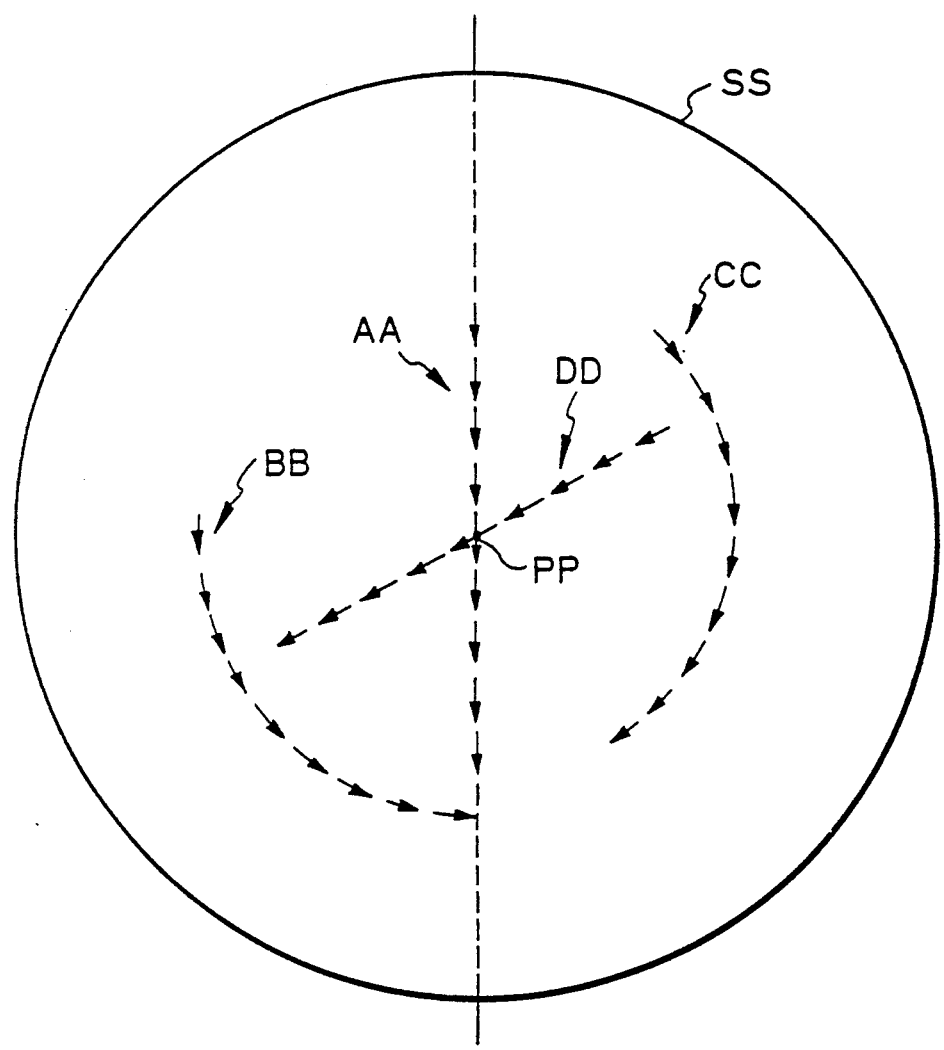
FIG. 11 is a diagram indicating a bright line drawn on the inner wall of the dome.

FIG. 11 is a diagram indicating a bright line drawn on the inner wall of the dome. Note, in FIG. 11, a hemisphere shaped inner wall (2a) of the dome (2) as defined in FIG. 8, is shown in a flat plane. In FIG. 11, the circle SS surrounding the circumference thereof denotes an equator, and the center PP of the circle denotes a pole point. Further, in FIG. 11, the broken line denotes a scanning direction of a light beam (LB), and the light beam is scanned from the top to the bottom along the broken line in the drawing.

Note, each of four lines AA to DD indicated by a plurality of connected arrows denotes a bright line. Concretely, the bright line AA corresponds to the above case shown in FIG. 9, and the bright lines BB and CC correspond to the above case shown in FIG. 10. In the four lines AA to DD in FIG. 11, for example, one arrow denotes data detected by one optical sensor cell (21). Namely, in FIG. 11, the bright line AA indicates that the tube body 101 is at right angles to the light beam (or the plane PL1), and the bright lines BB and CC indicate that the tube body 201 is inclined to the light beam (or the plane PL2) by a specific value. The inclined value is obtained by the value of the shift of the pole point. Further, the bright line DD indicates that the tube body 101 is rotated relative to the light beam axis by a specific value, as in the case shown in FIG. 9.

When a new detection is carried out by another optical cell, in response to the scan operation of the light beam, the direction of the arrow, or the direction of the reflected light, is discriminated by the address change between two (i.e., the new and the old) optical sensors. Consequently, the curve of the bright line and the positional data of the center of the bright line are obtained by combining the plurality of arrows.

As described above, a three-dimensional configuration of a tube body (a wire-shaped object 11, or a bonding wire 1) can be measured by the position and the curvature of the bright line, and thus the quality of the tube body, for example, the pitch of the adjacent bonding wires or an abnormal approach between the wire and the chip, can be discriminated. Consequently, the accuracy of the test can be increased, and the test becomes suitable for an automatic measurement.

Figure 12:
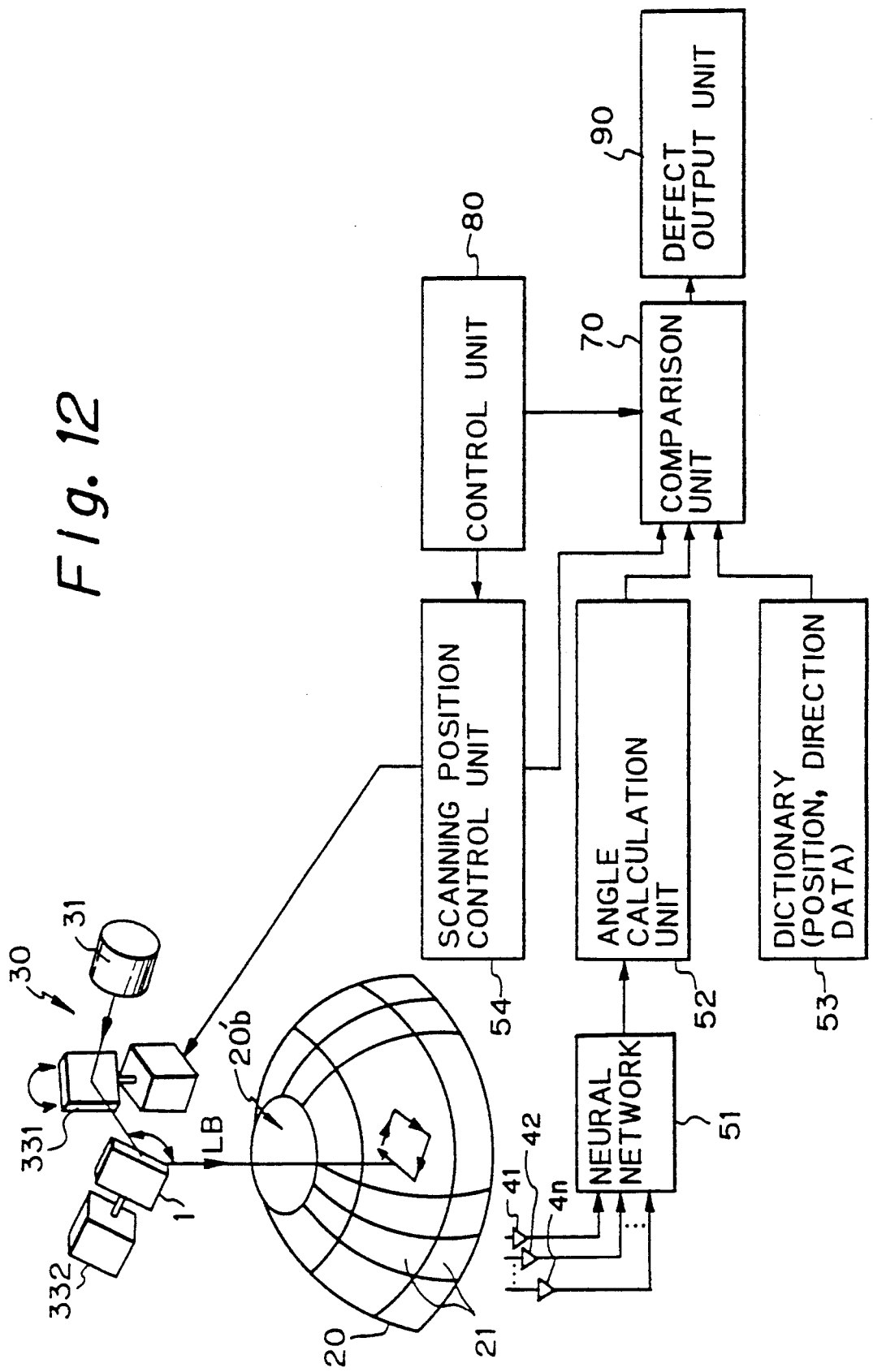
FIG. 12 is a diagram disclosing another embodiment of an apparatus for measuring a three-dimensional configuration of a wire-shaped object according to the present invention.

FIG. 12 is a diagram indicating another embodiment of an apparatus for measuring the three-dimensional configuration of a wire-shaped object according to the present invention.

When comparing the configuration shown in FIG. 12 with that shown in FIG. 8A, a light beam scanning unit 30, a top portion 20b' of the dome 20, and processing units 51 to 54, and elements 70 to 90 of this embodiment shown in FIG. 12 are different from that shown in FIG. 8A.

First, as shown in FIG. 12, in this embodiment, the light beam scanning unit 30 comprises two vibration mirrors 331 and 332 for scanning the light beam LB in both an X-direction and a Y-direction. Namely, in the embodiment shown in FIG. 8A, the light beam LB can be scanned in only the Y-direction. Note, in FIG. 12, the lenses 32 and 34 shown in FIG. 8A are omitted.

Next, as shown in FIG. 12, the top portion 20b of the dome 20 has a circular opening for the light beam LB scanned by the light beam scanning unit 30. Namely, the light beam LB is scanned, or moved, in both the X-direction and the Y-direction, and thus the shape of the top portion 20b' is preferably a circle. If the top portion of the dome 20 (2) is a slit along the Y-direction as shown in FIG. 8A, the scanning in the X-direction, or a movement of the light beam along the X-direction, cannot be obtained.

Further, as shown in FIG. 12, output signals of the optical sensor cells 21 are applied to the neural network 51 through a plurality of amplifiers 41 to 4n, and output signals of the neural network 51 are applied to the angle calculation unit 52. The scanning position control unit 54 controls the light beam scanning unit 30 in accordance with control signals output from the control unit 80, and output signals of the scanning position control unit 54 are applied to the comparison unit 70. The comparison unit 70 also receives data (position and direction data) stored in the dictionary 53, output signals of the angle calculation unit 52, and control signals of the control unit 80, and compares the measured data of the wire-shaped object with reference data prestored in the dictionary 53. The results compared in the comparison unit 70 are applied to the defect output unit 90, e.g., a display device, a printer, and the like.

FIG. 13A is a diagram indicating a configuration of a neural network shown in FIG. 12, and FIG. 13B is a diagram indicating angles obtained by the neural network shown in FIG. 13A.

As shown in FIG. 13A, the neural network 51 is, for example, constituted by three stages S1 to S3. Namely, the neural network 51 comprises an input layer S1, a hidden layer S2, and an output layer S3. Each of the layers S1 to S3 is constituted by a plurality of units (not shown in FIG. 13), and each unit of the hidden layer S2 is connected to all units of the input layer S1 and all units of the output layer S3. The output signals of the optical sensor cells 21 are amplified by the amplifiers 41 to 4n and applied to the input layer S1. Note, in the neural network 51, the output signals of the optical sensor cells 21 are learned in the neural network 51 by connection weight (or connection strength) of each of the stages (or each two units provided in different stages). Note, when using the neural network 51 to calculate (obtain) the three-dimensional configuration of a bonding wire 1 (wire-shaped object 11), noise components (for example, noise light reflected from the semiconductor chip) can be deleted from the reflected light from the surface of the bonding wire 1.

Concretely, the manner of learning in the neural network 51 is carried out by changing the values of a rotational angle $\alpha$ and a slope angle $\beta$ (which are shown in FIG. 13B) and inputting the output signal of each of the optical sensor cells 21 into the neural network 51, and determining the connection weight to output correct angles $\alpha$ and $\beta$. Consequently, in the neural network 51, the angles $\alpha$ and $\beta$ are calculated in a short time by using the learning function thereof. As shown in FIG. 13B, the angle $\alpha$ indicates a rotational angle of the bonding wire 1 (wire-shaped object 11) in a horizontal plane (X-Y plane), and the angle $\beta$ indicates a slope angle of the bonding wire 1 in a vertical plane (Y-Z plane, or Z-X plane). Note, the angle $\beta$ ($90° - \theta$) is required to be below 45 degrees. Namely, when the angle $\beta$ is specified over 45 degrees, the light reflected from the surface of the bonding wire 1 cannot arrive at the optical sensor cells 21 provided in the inner wall of the dome.

Figure 13C:
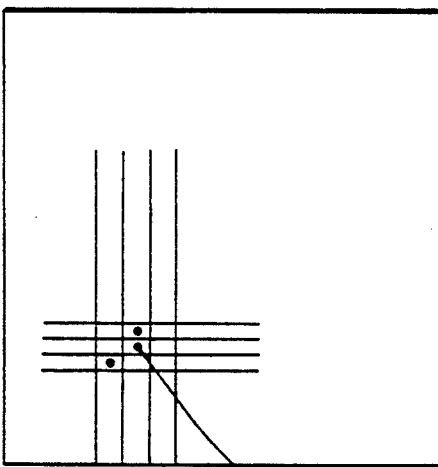
FIG. 13C is a diagram indicating a conceptual configuration of the memory unit shown in FIG. 13A.

FIG. 13C is a diagram indicating a conceptual configuration of the memory unit shown in FIG. 13A. The angles α and β output from the neural network 51 are applied to a memory unit MR of FIG. 13A. Note, for example, the light beam LB is scanned on a specific bonding wire 1 many times, and angle data at a plurality of portions of the bonding wire 1 are stored in the memory unit MR as a map. Then, combining the angle data stored in the memory unit MR, a profile (three-dimensional configuration) of the specific bonding wire 1 is obtained. Further, as described above, the output signals (for example, position and direction data of the bonding wire 1) of the angle calculation unit 52 are applied to the comparison unit 70 and are compared with reference data output from the dictionary 53. Note, the neural network 51 can be formed in various configurations.

Figure 14A:
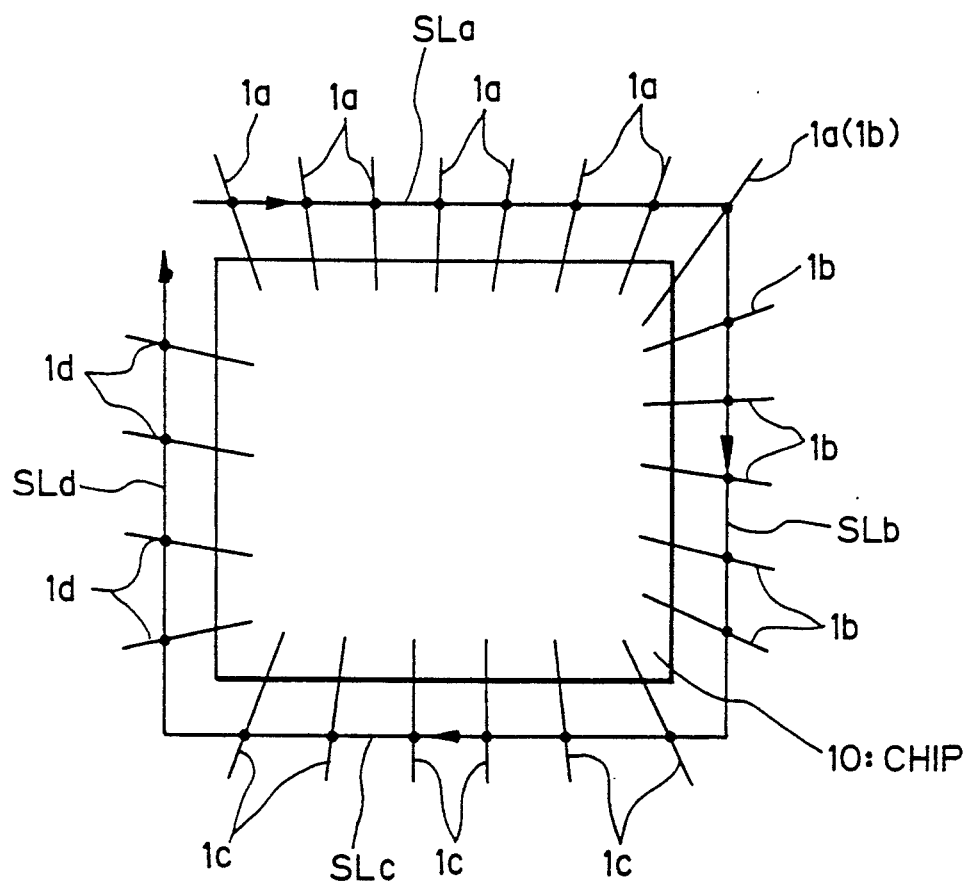
FIGS. 14A to 14C are diagrams for explaining scan operations in the embodiment of the apparatus shown in FIG. 12.
Figure 14B:
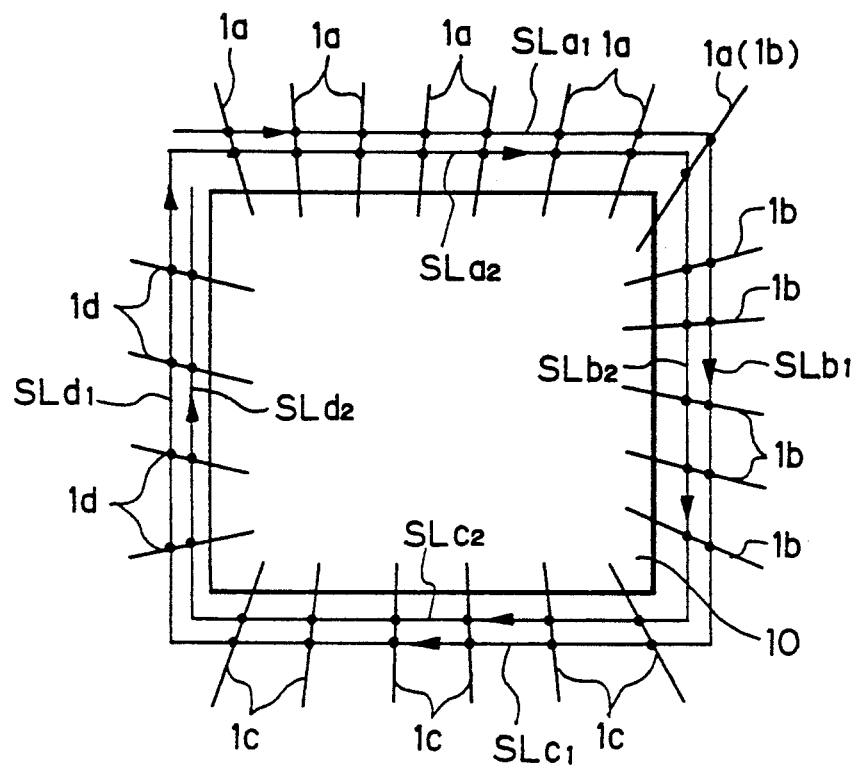
Figure 14C:
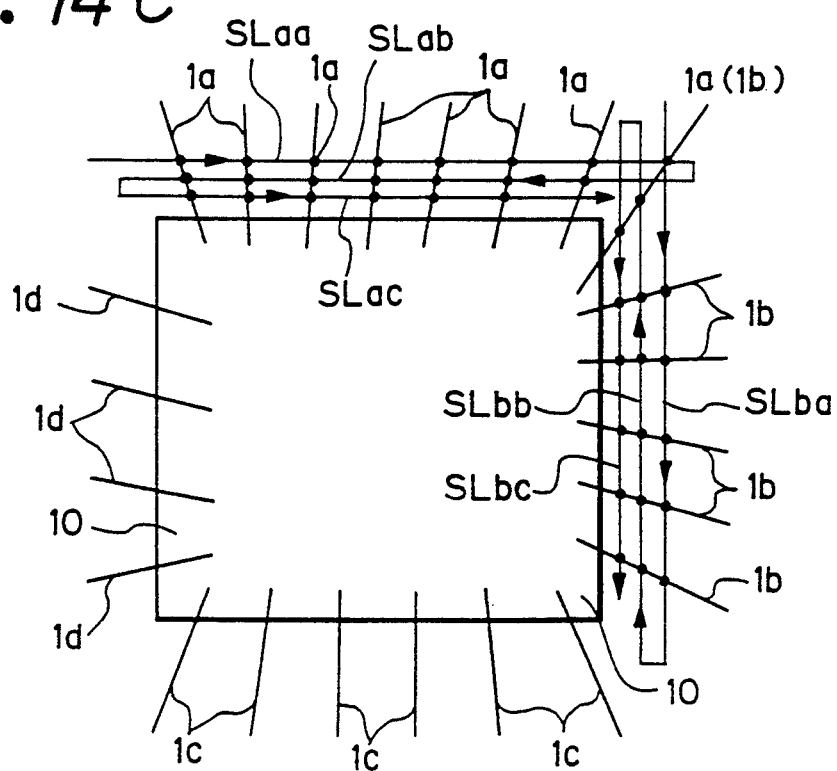

FIGS. 14A to 14C are diagrams for explaining scan operations in the embodiment of the apparatus shown in FIG. 12. In FIGS. 14A to 14C, references 1a to 1d denote bonding wires, and SL (SLa to SLd, and the like) denote a scanning line. Note, as described above, with reference to FIG. 12, the light beam scanning unit 30 comprises two vibration mirrors 331 and 332 for scanning the light beam LB in both an X-direction and a Y-direction.

First, an example of the scan operations of the apparatus shown in FIG. 12 is carried out such that a light beam LB is scanned in a square-shape along the circumference of the semiconductor chip 10. Namely, as shown in FIG. 14A, the light beam LB is successively scanned along the scanning lines SLa, SLb, SLc, SLd, or the light beam LB is successively scanned on a center position of each of a plurality of bonding wires 1a, 1b, 1c, 1d. Note, a center position of the abnormal (defective) bonding wire (for example, shown in FIGS. 1B to 1D) is not the same as that of the normal bonding wire (for example, shown in FIG. 1A), and thus the defective bonding wire can be determined by only impinging the light beam LB on the center position of the bonding wire and detecting the reflected light therefrom.

Next, another example of the scan operations of the apparatus shown in FIG. 12 is carried out such that a light beam LB is scanned as describing a square-shape along the circumference of the semiconductor chip 10 in many times. Namely, as shown in FIG. 14B, the light beam LB is successively scanned along scanning lines SLa₁, SLb₁, SLc₁, SLd₁, SLa₂, SLb₂, SLc₂, SLd₂, ..., or the light beam LB is successively scanned on the plurality of bonding wires 1a, 1b, 1c, 1d, 1a, 1b, 1c, 1d, ... many times.

Furthermore, still another example of the scan operations of the apparatus shown in FIG. 12 is carried out such that a light beam LB is scanned, both going (i.e., advancing) and returning along each side of the semiconductor chip 10.

Namely, as shown in FIG. 14C, the light beam LB is successively scanned along scanning lines SLaa, SLab, SLac, or scanned on the bonding wires 1a by going and returning, and then the light beam LB is successively scanned along scanning lines SLba, SLbb, SLbc, or scanned on the bonding wires 1b by going and returning.

Similarly, the bonding wires 1c and 1d are scanned by the light beam LB.

In accordance with the present invention as described above, a light beam is scanned on the surface of a wire-shaped object, and light reflected from the surface of the wire-shaped object is detected by a plurality of optical sensor cells mounted on an inner wall of a reflected light detection unit. Therefore, a three-dimensional configuration of the wire-shaped object can be automatically measured from a bright line drawn on the inner wall of the reflected light detection unit.

Many widely differing embodiments of the present invention may be constructed without departing from the spirit and scope of the present invention, and it should be understood that the present invention is not limited to the specific embodiments described in this specification, except as defined in the appended claims.

We claim:

1. A method of measuring a wire-shaped object including a surface having a regular reflection and a circular section, comprising:

disposing at least a portion of the wire-shaped object within a reflected light detection means having an inner wall on which are mounted a plurality of optical sensor cells and having a top portion with an opening therein providing for passage therethrough of a scanning light beam from the exterior of and to the interior of the reflected light detection means;

scanning a light beam on the surface of said wire-shaped object including selectively deflecting the light beam in both of orthogonal, X- and Y- directions, by a light beam scanning means;

detecting the light beam reflected from the surface of said wire-shaped object by said plurality of optical sensor cells, said optical sensor cells producing respective output signals in accordance with the detection thereby of the reflected light beam; and measuring the three-dimensional configuration of said wire-shaped object in accordance with the respective output signals from said plurality of optical sensor cells.

2. A method of measuring a wire-shaped object as claimed in claim 1, wherein said measuring step includes the steps of:

confirming the respective positions of said plurality of optical sensor cells producing said respective output signals in response to detecting said reflected light beam; and measuring the three-dimensional configuration of said wire-shaped object in accordance with the confirmed, respective positions of said plurality of optical sensor cells.

3. A method of measuring a wire-shaped object as claimed in claim 1, wherein said reflected light detection means is a hemispherical dome.

4. A method of measuring a wire-shaped object as claimed in claim 1, wherein said reflected light detection means has a half polyhedron shape.

5. A method of measuring a wire-shaped object as claimed in claim 1, wherein said wire-shaped object comprises a bonding wire connecting a semiconductor chip and a lead frame.

6. A method of measuring a wire-shaped object as claimed in claim 5, further comprising placing said semiconductor chip and said lead frame on a detection table prior to scanning same.

7. A method of measuring a wire-shaped object as claimed in claim 6, further comprising selectively moving said detection table in a plane defined by the X and Y directions and rotating same about a Z-axis orthogonally related to the X-Y plane.

8. A method of measuring a wire-shaped object as claimed in claim 1, wherein the top portion of said reflected light detection means has a circular-shaped opening.

9. A method of measuring a wire-shaped object as claimed in claim 8, wherein said wire-shaped object comprises a bonding wire connecting a semiconductor chip and a lead frame.

10. A method of measuring a wire-shaped object as claimed in claim 9, wherein said semiconductor chip has a square-shape, further comprising scanning the light beam in a corresponding square-shape along the circumference of said semiconductor chip.

11. A method of measuring a wire-shaped object as claimed in claim 9, further comprising scanning the light beam in advancing and returning directions along each side of said semiconductor chip.

12. An apparatus for measuring a wire-shaped object having a surface of a regular reflection and a circular section comprising:
  light beam scanning means for scanning a light beam in both of an X-direction and a Y-direction on the surface of said wire-shaped object;
  reflected light detection means, having an inner wall, for receiving within the interior thereof and thereby covering said wire-shaped object and having a top portion with an opening therethrough for permitting passage through the opening of the light beam when scanned in both the X-direction and the Y-direction;
  a plurality of optical sensor cells, mounted on the inner wall of said reflected light detection means, for detecting light reflected from the surface of said wire-shaped object, and each of said optical sensor cells being defined by an address identifying the position thereof on the inner wall of said reflected light detection means and producing an output signal in accordance with the detection thereby of said reflected light;
  calculation means for receiving the respective output signals from, and the addresses of, said plurality of optical sensor cells and for calculating the direction of a bright line formed by said reflected light and producing a corresponding output, in acocrdance with the respective output signals from said plurality of optical sensor cells and the respective addresses of the optical sensor cells receiving said reflected light and producing the respective output signals corresponding to the bright line; and
  reconstruction means for receiving the output of said calculation means and reconstructing the three-dimensional configuration of said wire-shaped body in accordance with the output from said calculation means and producing a corresponding reconstructed data output.

13. An apparatus for measuring a wire-shaped object as claimed in claim 12, wherein saidr reflected light detection means formed as a hemispherical dome.

14. An apparatus for measuring a wire-shaped object as claimed in claim 12, wherein said reflected light detection means has a half polyhedron shape.

15. An apparatus for measuring a wire-shaped object as claimed in claim 12, wherein said light beam scanning means comprises:
  a light beam source for generating and producing the light beam as an output;
  a group of lenses for enlarging the diameter of the light beam output by said light beam source;
  a vibrating mirror for producing linear scanning of the light beam; and
  a focusing lens for focusing the light beam onto the surface of said wire-shaped object.

16. An apparatus for measuring a wire-shaped object as claimed in claim 12, wherein said wire-shaped object comprises a bonding wire connecting a semiconductor chip and a lead frame.

17. An apparatus for measuring a wire-shaped object as claimed in claim 16, further comprising a detection table, said semiconductor chip and said lead frame being placed on said detection table for being scanned by said scanning light beam.

18. An apparatus for measuring a wire-shaped object as claimed in claim 17, wherein said detection table is movable in an X-Y plane and rotatable about a Z-axis transverse to the X-Y plane.

19. An apparatus for measuring a wire-shaped object as claimed in claim 12, wherein said apparatus further comprises:
  defect discrimination means for receiving and discriminating the quality of the reconstructed data output of said reconstruction means by comparing the reconstructed data with three-dimensional reference data and producing a corresponding discriminated result output;
  a detection table, said wire-shaped object being placed on said detection table for being scanned by said scanning light beam;
  control means for controlling the movement of said detection table and for controlling the operations of the reconstruction means and said defect discrimination means; and
  output means for receiving and outputting the discriminated result output of said defect discrimination means.

20. An apparatus for measuring a wire-shaped object as claimed in claim 12, wherein said light beam scanning means further comprises:
  a light beam source for generating and producing the light beam as an output;
  a group of lenses for enlarging the diameter of the light beam, as output from said light beam source;
  a first vibrating mirror for producing X-direction scanning of the light beam;
  a second vibrating mirror for producing Y-direction scanning of the light beam; and
  a focusing lens for focusing the light beam onto the surface of said wire-shaped object.

21. An apparatus for measuring a wire-shaped object as claimed in claim 20, wherein the top portion of said reflected light detection means has a circular-shaped opening.

22. An apparatus for measuring a wire-shaped object as claimed in claim 21, wherein said wire-shaped object comprises a bonding wire connecting a semiconductor chip and a lead frame.

23. An apparatus for measuring a wire-shaped object as claimed in claim 22, wherein said semiconductor chip has a square shape, said scanning means scanning the light beam in a corresponding square-shape along the circumference of said semiconductor chip.

24. An apparatus for measuring a wire-shaped object as claimed in claim 22, said scanning means scanning the light beam in advancing and returning directions along each side of said semiconductor chip.

25. An apparatus for measuring a wire-shaped object as claimed in claim 12, wherein said calculation means comprises a neural network, and said reconstruction means comprises an angle calculation means for producing an angle calculation results output.

26. An apparatus for measuring a wire-shaped object as claimed in claim 25, wherein said apparatus further comprises:

control means;

scanning position control means for controlling said light beam scanning means in accordance with control signals output by said control means;

dictionary means for prescoring reference position and direction data and providing said data as an output;

comparison means for comparing the angle calculation results output of said angle calculation means with the reference position and direction data output provided by said dictionary means and producing a compared results output; and defect output means for receiving and outputting the compared results output of said comparison means.

* * * * *

UNITED STATES PATENT AND TRADEMARK OFFICE
CERTIFICATE OF CORRECTION

PATENT NO. : 5,243,406
DATED : Sep. 7, 1993
INVENTOR(S) : ANDO et al.

It is certified that error appears in the above-indentified patent and that said Letters Patent is hereby corrected as shown below:

Col. 3,    line 14, change "a" to --for--;
           line 23, after "mented" insert --)--.

Col. 5,    line 62, change "impinges" to --impinge--.

Col. 15,   line 59, change "saidr" to --said--.
           line 60, after "means" insert --is--.

Signed and Sealed this

Sixteenth Day of August, 1994

Attest:

BRUCE LEHMAN

*Attesting Officer*      *Commissioner of Patents and Trademarks*